United States Patent
Ho et al.

(10) Patent No.: US 9,548,265 B2
(45) Date of Patent: Jan. 17, 2017

(54) CHIP PACKAGE AND MANUFACTURING METHOD THEREOF

(71) Applicant: XINTEC INC., Taoyuan (TW)

(72) Inventors: Yen-Shih Ho, Kaohsiung (TW); Shu-Ming Chang, New Taipei (TW); Hsing-Lung Shen, Hsinchu (TW); Yu-Hao Su, New Taipei (TW); Kuan-Jung Wu, Taoyuan (TW); Yi Cheng, Tainan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/138,119

(22) Filed: Apr. 25, 2016

(65) Prior Publication Data

US 2016/0315043 A1   Oct. 27, 2016

Related U.S. Application Data

(60) Provisional application No. 62/153,400, filed on Apr. 27, 2015.

(30) Foreign Application Priority Data

Aug. 17, 2015 (TW) .............................. 104126716 A

(51) Int. Cl.
*H01L 23/495* (2006.01)
*H01L 23/498* (2006.01)
*H01L 21/48* (2006.01)
*H01L 21/687* (2006.01)
*H01L 49/02* (2006.01)

(52) U.S. Cl.
CPC ....... *H01L 23/49838* (2013.01); *H01L 21/486* (2013.01); *H01L 21/4846* (2013.01); *H01L 21/4853* (2013.01); *H01L 21/68721* (2013.01); *H01L 23/498* (2013.01);
(Continued)

(58) Field of Classification Search
CPC .................... H01L 23/49838; H01L 23/49827; H01L 23/49811; H01L 23/498; H01L 21/4853; H01L 21/486; H01L 21/4846; H01L 21/68721; H01L 24/25; H01L 24/82; H01L 24/24; H01L 2224/3225; H01L 2224/73267; H01L 2224/8203; H01L 2224/04105; H01L 2224/24226; H01L 2224/92244
See application file for complete search history.

(56) References Cited

U.S. PATENT DOCUMENTS 5,985,126 A   11/1999   Bleck et al.
7,022,211 B2   4/2006   Yoshioka et al.
(Continued)

*Primary Examiner* — (Vikki) Hoa B Trinh
(74) *Attorney, Agent, or Firm* — Liu & Liu

(57) ABSTRACT

A chip package includes a chip, an isolation layer, and a redistribution layer. The chip has a substrate, an electrical pad, and a protection layer. The substrate has a first surface and a second surface. The substrate has a through hole, and protection layer has a concave hole, such that the electrical pad is exposed through the concave hole and the through hole. The isolation layer is located on the second surface, the sidewall of the through hole, and the sidewall of the concave hole. The redistribution layer includes a connection portion and a passive element portion. The connection portion is located on isolation layer and in electrical contact with the electrical pad. The passive element portion is located on isolation layer that is on second surface, and an end of passive element portion is connected to connection portion that is on the second surface.

26 Claims, 15 Drawing Sheets

(52) U.S. Cl.
CPC .. *H01L 23/49811* (2013.01); *H01L 23/49827* (2013.01); *H01L 28/10* (2013.01)

(56) References Cited

U.S. PATENT DOCUMENTS

| | | |
|---|---|---|
| 7,833,393 B2 | 11/2010 | Yoshioka et al. |
| 8,466,062 B2 | 6/2013 | Lu et al. |
| 8,692,382 B2 * | 4/2014 | Yen .................. B81B 7/007 257/773 |
| 8,710,680 B2 | 4/2014 | Chang et al. |
| 8,961,755 B2 | 2/2015 | Yoshioka et al. |
| 2008/0277799 A1 | 11/2008 | Benson et al. |
| 2015/0041980 A1 | 2/2015 | Ahn et al. |

* cited by examiner

CHIP PACKAGE AND MANUFACTURING METHOD THEREOF

RELATED APPLICATIONS

This application claims priority to U.S. Provisional Application Ser. No. 62/153,400 filed Apr. 27, 2015, and Taiwan Application Serial Number 104126716, filed Aug. 17, 2015, the disclosures of which are incorporated herein by reference in their entireties.

BACKGROUND

Field of Invention

The present invention relates to a chip package and a manufacturing method of the chip package.

Description of Related Art

A typical RF sensor includes a chip package and passive components. The passive components can be, for example, inductors. And the chip package is used as an active component. Both the chip package and the inductors are disposed on a printed circuit board, and the inductors are placed outside the chip package.

That is to say, after the chip package is manufactured, additional and independent inductors are required to be arranged on the printed circuit board to allow the RF sensor working properly. However, it leads to a lot of assembly time for the RF sensor, and makes it difficult to reduce the cost of the inductors. Moreover, additional space and circuits need to be reserved on the printed circuit board, thereby causing design inconvenience.

SUMMARY

An aspect of the present invention is to provide a chip package.

According to an embodiment of the present invention, a chip package includes a chip, an isolation layer and a redistribution layer. The chip has a substrate, an electrical pad and a protection layer. The substrate has a first surface and an opposite second surface. The protection layer is located on the first surface, and the electrical pad is located in the protection layer. The substrate has a through hole, and the protection layer has a concave hole, such that the electrical pad is exposed through the concave hole and the through hole. The isolation layer is located on the second surface, a sidewall of the through hole, and a sidewall of the concave hole. The redistribution layer includes a connection portion and a passive component portion. The connection portion is located on the isolation layer and in electrical contact with the electrical pad. The passive component portion is located on the isolation layer that is on the second surface, and an end of the passive component portion is connected to the connection portion that is on the second surface.

Another aspect of the present invention is to provide a manufacturing method of a chip package.

According to an embodiment of the present invention, a manufacturing method of a chip package includes the following steps. The manufacturing method of a chip package includes the following steps. A temporary adhesive layer is used to attach a carrier to a wafer. The wafer has a substrate, an electrical pad and a protection layer. The substrate has a first surface and an opposite second surface. The protection layer is located on the first surface, and the electrical pad is located in the protection layer. The second surface of the substrate is etched to form a through hole in the substrate. The protection layer in the through hole is etched, such that a concave hole is formed in the protection layer, and the electrical pad is exposed through the concave hole and the through hole. An isolation layer is formed on the second surface, a sidewall of the through hole, and a sidewall of the concave hole. A redistribution layer is formed on the isolation layer and the electrical pad. The redistribution layer is patterned to simultaneously form a connection portion and a passive component portion in the redistribution layer. The connection portion is located on the isolation layer and in electrical contact with the electrical pad. The passive component portion is located on the isolation layer that is on the second surface, and an end of the passive component portion is connected to the connection portion that is on the second surface.

In the aforementioned embodiments of the present invention, since the redistribution layer of the chip package has a passive component portion, the chip package thereby has both the functions of an active component and of an passive component. For example, the passive component portion can be used as the inductor of the chip package. While patterning the redistribution layer, both the passive component portion and the connection portion are formed simultaneously, such that the passive component portion is formed on the isolation layer that is on the second surface of the substrate. Hence, the required time for manufacturing the passive component portion may be saved. The chip package of the present invention may be used as a RF sensor which do not require a typical independent inductor but still has an inductor function. As a result, both the assembly time of the chip package and the cost can be saved, since no typical inductor is required. Besides, a printed circuit board for placing the chip package does not need to reserve space and wires for disposing the typical inductor, thereby enhancing the design convenience.

Another aspect of the invention is to provide a semiconductor electroplating system.

According to an embodiment of the present invention, a semiconductor electroplating system includes a conducting ring and at least one conductive device. The conducting ring is used for carrying a wafer. The conducting ring has at least two connecting points. The wafer has a first surface and an opposite second surface. An isolation layer is located on the second surface. Two ends of the conductive device are respectively connected to the two connecting points of the conducting ring. When the conducting ring is immersed in the plating solution and is energized, a redistribution layer that is to be patterned is formed on the isolation layer. The conductive device is used for transmitting a partial current that passes through one of the connecting points to the other connecting point.

Another aspect of the invention is to provide a semiconductor electroplating system.

According to an embodiment of the present invention, a semiconductor electroplating system includes a conducting ring and at least one conductive piece. The conducting ring is used for carrying a wafer. The conducting ring has a ring-shaped track. The wafer has a first surface and an opposite second surface. The isolation layer is located on the second surface. Each of two ends of the conductive piece has a connecting point. Each of the connecting points is movably connected to the ring-shaped track of the conducting ring, and the conductive piece overlaps a portion of the conducting ring. When the conducting ring is immersed in the plating solution and is energized, a redistribution layer that is to be patterned is formed on the isolation layer. The conductive piece is used for transmitting a partial current that passes through one of the connecting points to the other connecting point.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
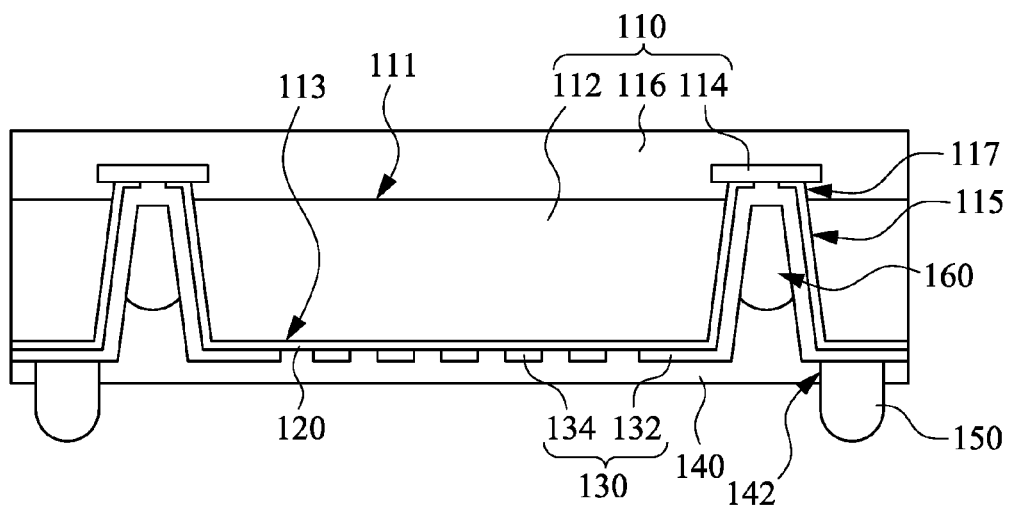
FIG. 1 is a cross-sectional view of a chip package according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
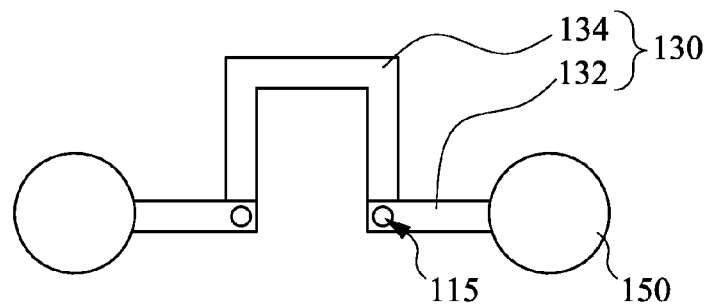
FIG. 2 is a schematic view of a layout of a redistribution layer of the chip package shown in FIG. 1.

FIG. 1 is a cross-sectional view of a chip package 100 according to an embodiment of the present invention. FIG. 2 is a schematic view of a layout of a redistribution layer 130 of the chip package 100 shown in FIG. 1. As shown in FIG. 1 and FIG. 2, the chip package 100 includes a chip 110, an isolation layer 120, and a redistribution layer (RDL) 130. The chip 110 has a substrate 112, an electrical pad 114 and a protection layer 116. The substrate 112 has a first surface 111 and an opposite second surface 113. The protection layer 116 is located on the first surface 111. The electrical pad 114 is located in the protection layer 116. The substrate 112 has a through hole 115, and the protection layer 116 has a concave hole 117, such that the electrical pad 114 is exposed through the concave hole 117 and the through hole 115. The isolation layer 120 is located on the second surface 113, the sidewall of the through hole 115, and the sidewall of the concave hole 117. The redistribution layer 130 includes a connection portion 132 and a passive component portion 134. The connection portion 132 is located on the isolation layer 120 and in electrical contact with the electrical pad 114. The passive component portion 134 is located on the isolation layer 120 that is on the second surface 113, and an end of the passive component portion 134 is connected to the connection portion 132 that is on the second surface 113.

In this embodiment, the chip package 100 may be a RF sensor, but the present invention is not limited in this regard. The substrate 112 may be made of a material including silicon. The protection layer 116 may include inter-layer dielectric (ILD), inter-metal dielectric (IMD), and passivation layer. The redistribution layer 130 may be made of a material including aluminum or copper, and the physical vapor deposition (PVD) method or the electroplating method may be used to form the redistribution layer 130 that covers the isolation layer 120 and the electrical pad 114, then a patterning process is used to simultaneously form the connection portion 132 and the passive component portion 134 in the redistribution layer 130. The patterning process may include photolithography techniques, such as exposure, developing and etching.

Since the redistribution layer 130 of the chip package 100 has a passive component portion 134, the chip package 100 thereby has both the function of a active component and a passive component. For instance, the passive component portion 134 can be used as the inductor of the chip package 100. The chip package 100 of the present invention has the inductor function without needing a conventional independent inductor. As a result, both the assembly time of the chip package and the cost can be saved, since no typical inductor is needed.

While patterning the redistribution layer 130, the passive component portion 134 and the connection portion 132 are formed simultaneously, such that the passive component portion 134 is formed on the isolation layer 120 that is on the second surface 113 of the substrate 112. Hence, the required time for manufacturing the passive component portion 134 is saved. In addition, a printed circuit board for placing the chip package 100 does not need to reserve space and wires for disposing a typical inductor, thereby enhancing the design convenience.

In this embodiment, the shape of the passive component portion 134 is U-shaped, however, it is not a restriction of the present invention. Designers can design the layout scheme of the redistribution layer 130 according to the design requirement, to change the shape of the passive component portion 134.

The chip package 100 further includes a barrier layer 140 and a conductive structure 150. The barrier layer 140 is located on the redistribution layer 130 and the isolation layer 120 that is on the second surface 113. The barrier layer 140 has an opening 142 to expose the connection portion 132. The conductive structure 150 is located on the connection portion 132 that is in the opening 142 of the barrier layer 140, such that the conductive structure 150 is electrically connected to the electrical pad 114 through the connection portion 132 of the redistribution layer 130. The conductive structure 150 may be a solder ball or a conductive bump of a ball grid array (BGA). Moreover, the chip package 100 may selectively has a cavity 160. The cavity 160 is located between the barrier layer 140 and the connection portion 132 that is in the through hole 115.

The manufacturing method of the chip package 100 will be described in the following descriptions.

Figure 3:
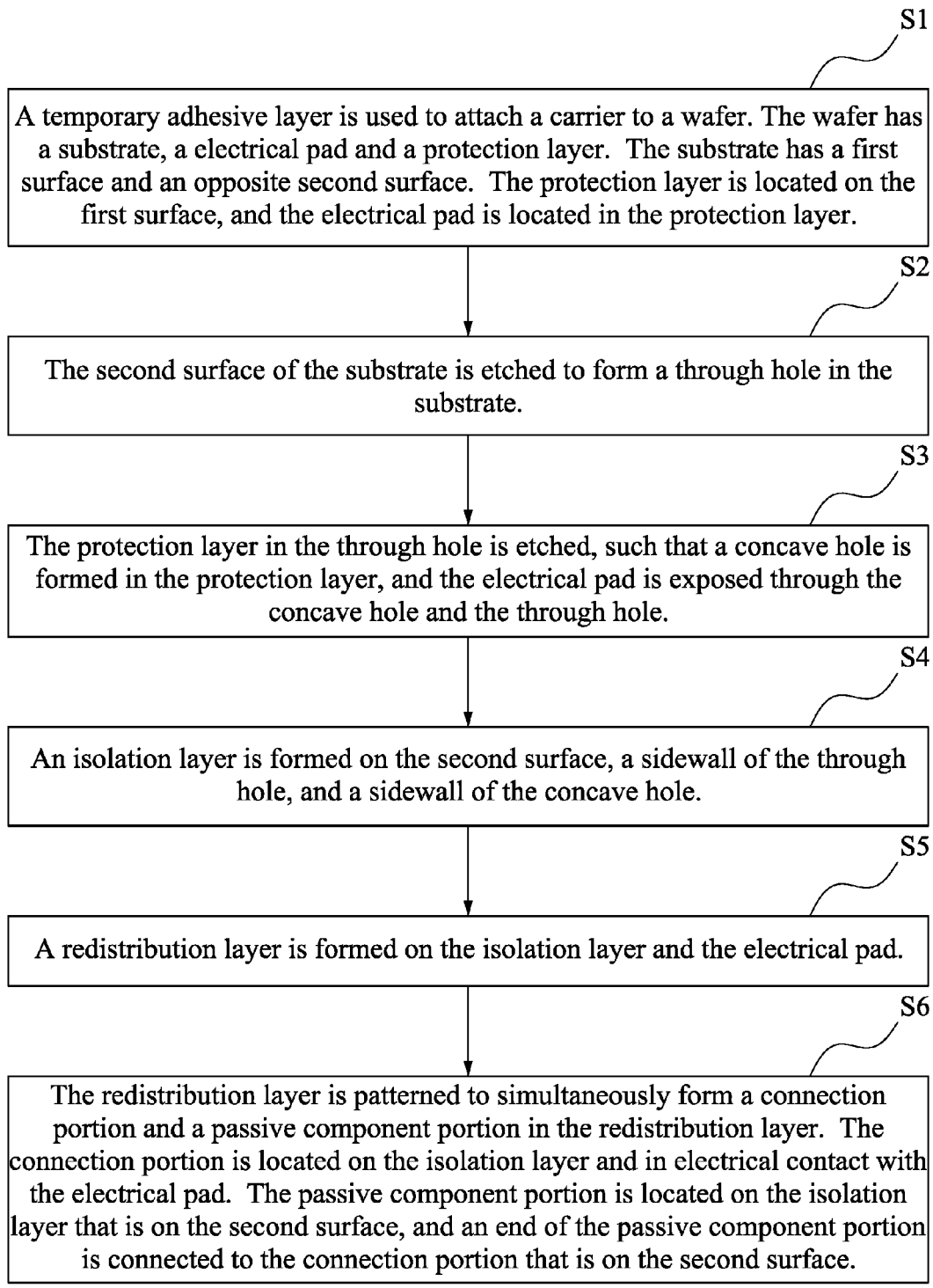
FIG. 3 is a flow chart of a manufacturing method of a chip package according to an embodiment of the present invention.

FIG. 3 is a flow chart of a manufacturing method of a chip package according to an embodiment of the present invention. The manufacturing method of the chip package includes the following steps. In step S1, a temporary adhesive layer is used to attach a carrier to a wafer. The wafer has a substrate, an electrical pad and a protection layer. The substrate has a first surface and an opposite second surface. The protection layer is located on the first surface, and the electrical pad is located in the protection layer. Next, in step S2, the second surface of the substrate is etched to form a through hole in the substrate. Thereafter, in step S3, the protection layer in the through hole is etched, such that a concave hole is formed in the protection layer, and the electrical pad is exposed through the concave hole and the through hole. Next, in step S4, an isolation layer is formed on the second surface, a sidewall of the through hole, and a sidewall of the concave hole. Thereafter, in step S5, a redistribution layer is formed on the isolation layer and the electrical pad. Finally, in step S6, the redistribution layer is patterned to simultaneously form a connection portion and a passive component portion in the redistribution layer. The connection portion is located on the isolation layer and in electrical contact with the electrical pad. The passive component portion is located on the isolation layer that is on the second surface, and an end of the passive component portion is connected to the connection portion that is on the second surface. The details of the aforementioned steps will be described in the following descriptions.

Figure 4:
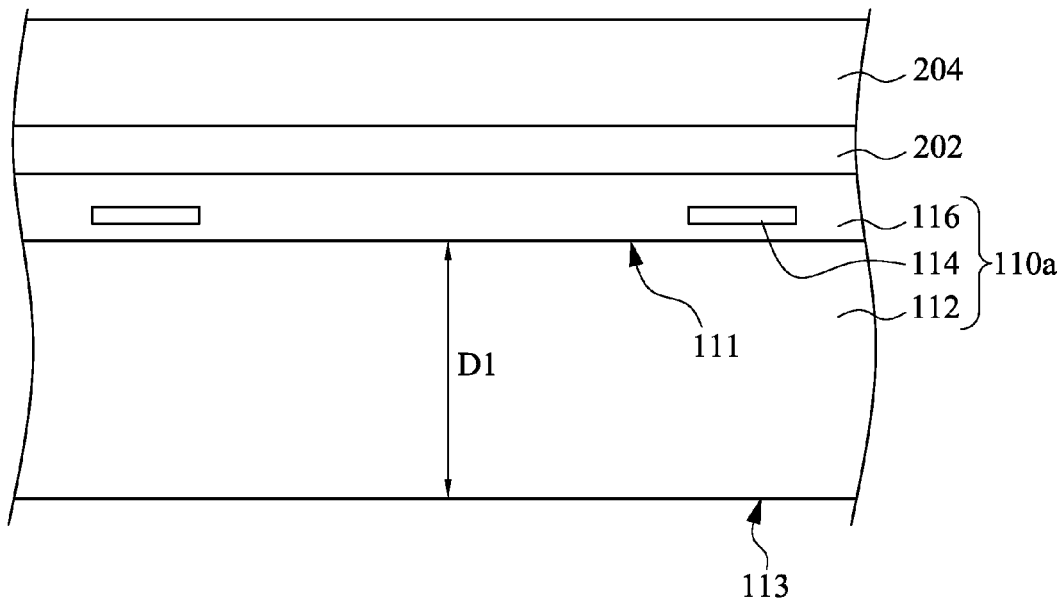
FIG. 4 is a cross-sectional view of a wafer after being attached by a carrier according to an embodiment of the present invention.
Figure 5:
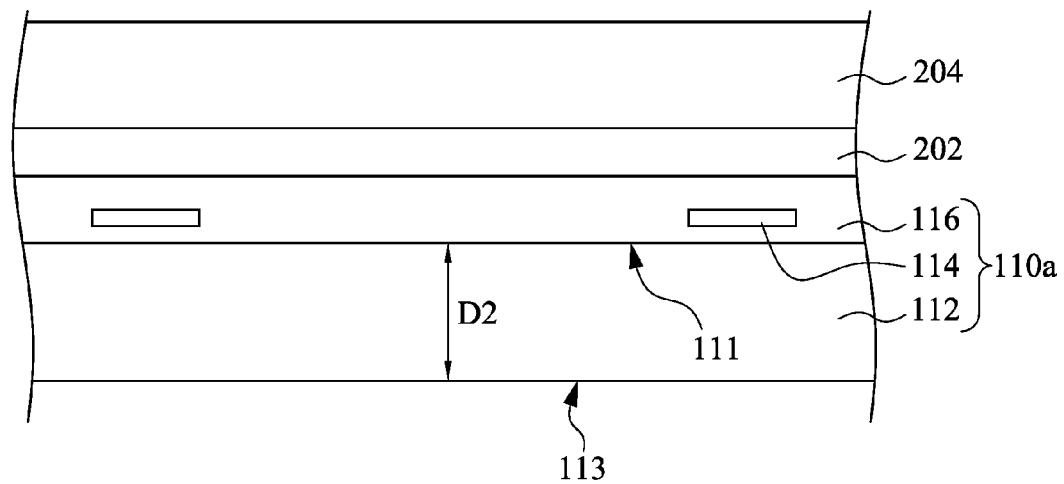
FIG. 5 is a cross-sectional view of a substrate shown in FIG. 4 after being ground.

FIG. 4 is a cross-sectional view of a wafer 110a after being attached by a carrier 204 according to an embodiment of the present invention. FIG. 5 is a cross-sectional view of the substrate 112 shown in FIG. 4 after being ground. In the following description, wafer 110a is referred to as a semiconductor structure that includes plural chips 110 of FIG. 1 before a cutting process. The wafer 110a has the substrate 112, the electrical pad 114, and the protection layer 116. As shown in FIG. 4 and FIG. 5, a temporary adhesive layer 202 is used to attach a carrier 204 onto a wafer 110a. The carrier 204 may be made of a material including a glass, for providing the support strength of the wafer 110a. Next, the second surface 113 of the substrate 112 may be ground, such that the thickness of the substrate 112 is reduced from D1 to D2.

Figure 6:
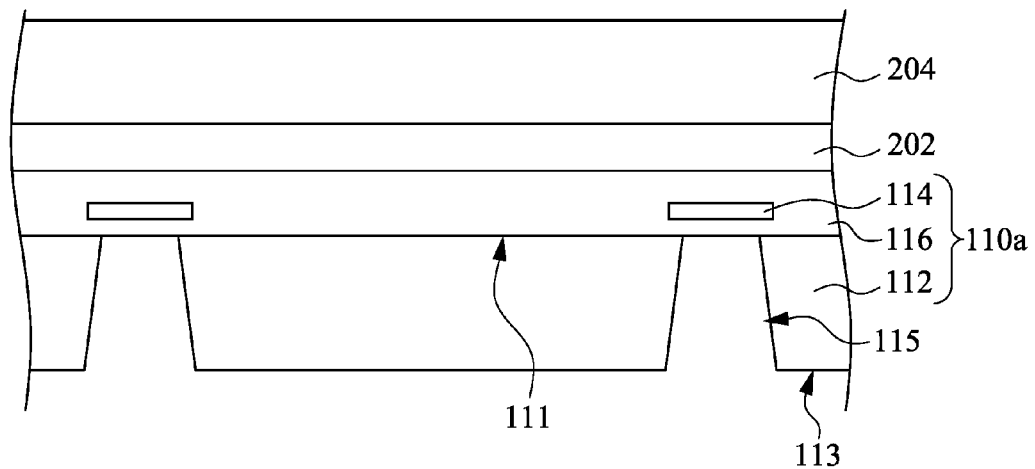
FIG. 6 is a cross-sectional view of a through hole after being formed in the substrate shown in FIG. 5.
Figure 7:
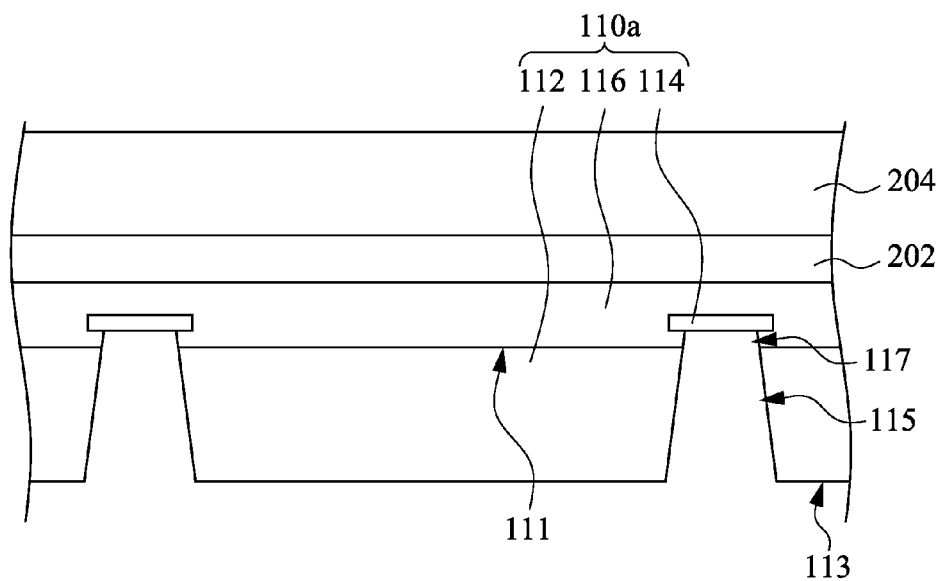
FIG. 7 is a cross-sectional view of a concave hole after being formed in a protection layer shown in FIG. 6.

FIG. 6 is a cross-sectional view of the through hole 115 after being formed in the substrate 112 shown in FIG. 5. FIG. 7 is a cross-sectional view of the concave hole 117 after being formed in the protection layer 116 shown in FIG. 6. As shown in FIG. 6 and FIG. 7, after the thickness of the substrate 112 is reduced, the second surface 113 of the substrate 112 may be etched, such that the through hole 115 which aligned with the electrical pad 114 is formed in the substrate 112. Next, the protection layer 116 in the through hole 115 is etched, such that a concave hole 117 aligned with the electrical pad 114 is formed in the protection layer 116. As a result, the electrical pad 114 is exposed through the concave hole 117 and the through hole 115.

Figure 8:
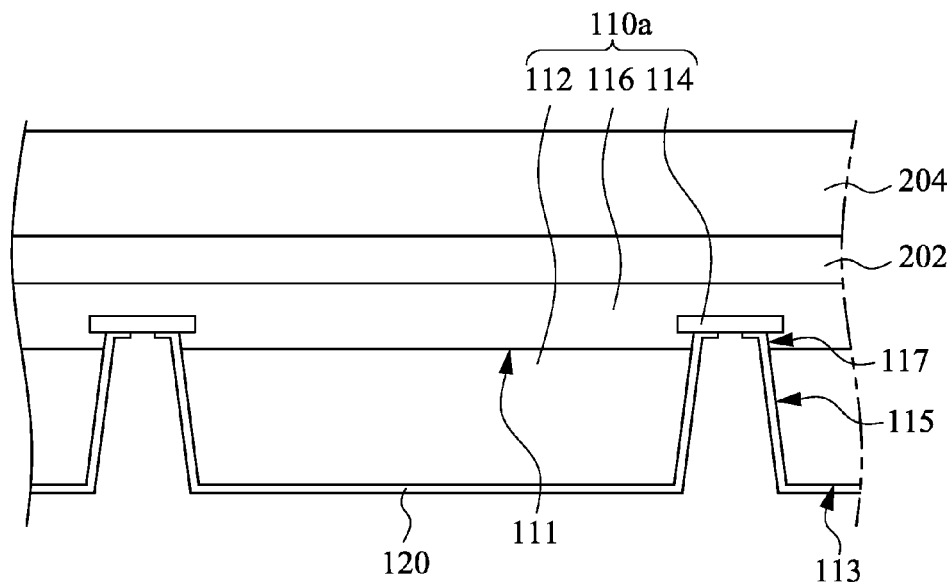
FIG. 8 is a cross-sectional view of an isolation layer after being formed on a second surface, a sidewall of the through hole, and a sidewall of the concave hole shown in FIG. 7.
Figure 9:
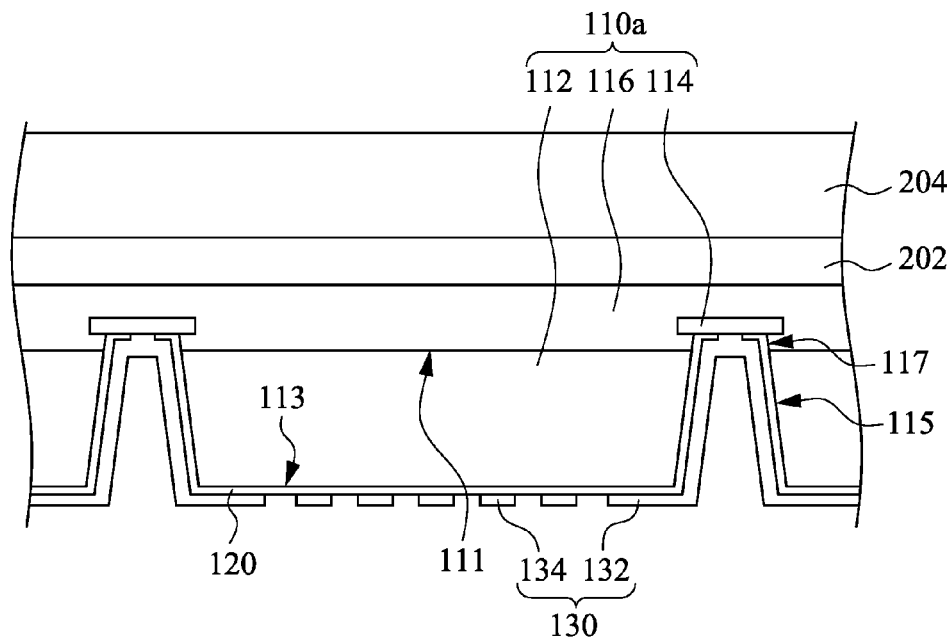
FIG. 9 is a cross-sectional view of the redistribution layer after being formed on the isolation layer and the electrical pad shown in FIG. 8.

FIG. 8 is a cross-sectional view of the isolation layer 120 after being formed on the second surface 113, the sidewall of the through hole 115, and the sidewall of the concave hole 117 shown in FIG. 7. FIG. 9 is a cross-sectional view of the redistribution layer 130 after being formed on the isolation layer 120 and the electrical pad 114 shown in FIG. 8 As shown in FIG. 8 and FIG. 9, after the electrical pad 114 is exposed through the concave hole 117 and the through hole 115, the isolation layer 120 may be formed on the second surface 113 of the substrate 112, the sidewall of the second surface 113, the sidewall of the through hole 115, and on the sidewall of the concave hole 117. The isolation layer 120 may be formed by a patterning process, such that at least one portion of the electrical pad 114 is covered by the isolation layer 120.

After the isolation layer 120 is formed, the redistribution layer 130 may be formed on the isolation layer 120 and the electrical pad 114. Next, the redistribution layer 130 is patterned to form the connection portion 132 and the passive component portion 134 simultaneously. The connection portion 132 is located on the isolation layer 120 and in electrical contact with the electrical pad 114. The passive component portion 134 is located on the isolation layer 120 that is on the second surface 113, and an end of the passive component portion 134 is connected to the connection portion 132 that is on the second surface 113.

Figure 10:
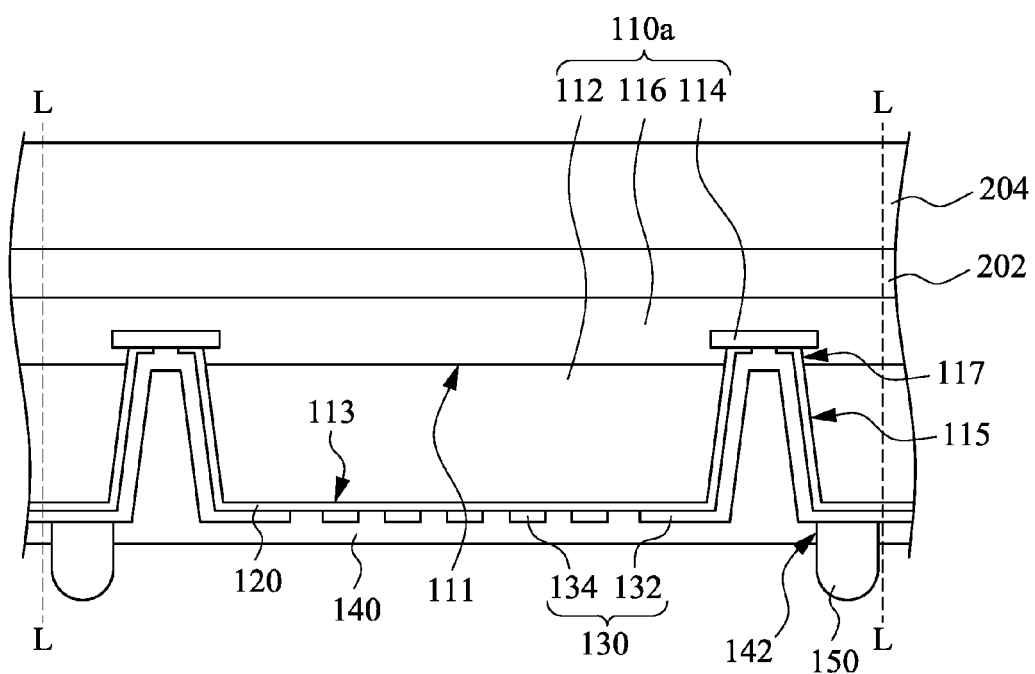
FIG. 10 is a cross-sectional view of a conductive structure after being formed on the redistribution layer shown in FIG. 9.

FIG. 10 is a cross-sectional view of the conductive structure 150 after being formed on the redistribution layer 130 shown in FIG. 9. As shown in FIG. 9 and FIG. 10, after the redistribution layer 130 is patterned to form the connection portion 132 and the passive component portion 134, the barrier layer 140 may be formed on the redistribution layer 130 and the isolation layer 120 that is on the second surface 113. Next, the barrier layer 140 is patterned to form an opening 142, such that the connection portion 132 of the redistribution layer 130 is exposed through the opening 142. Then, the conductive structure 150 may be formed on the connection portion 132 that is in the opening 142 of the barrier layer 140, such that the conductive structure 150 is electrically connected to the electrical pad 114 through the connection portion 132.

After the conductive structure 150 is formed, the carrier 204, the wafer 110a, the isolation layer 120 and the barrier layer 140 may be cut along line L-L. Next, the temporary adhesive layer 202 may be irradiated with ultraviolet light, raise the temperature, or be immersed in a chemical liquid, such that the adhesion of the temporary adhesive layer 202 is removed. As a result, the carrier 204 can be removed and thereby forming the chip package 100 of FIG. 1.

It is to be noted that the connection relationships and materials of the elements described above will not be repeated in the following description, and only aspects related to other types of chip package will be described.

Figure 11A:
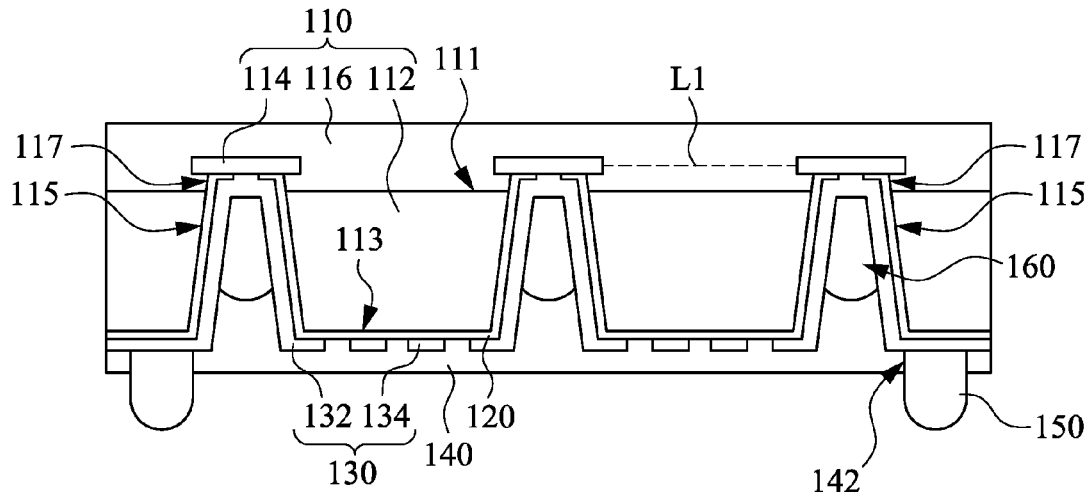
FIG. 11A is a cross-sectional view of a chip package according to another embodiment of the present invention.
Figure 11B:
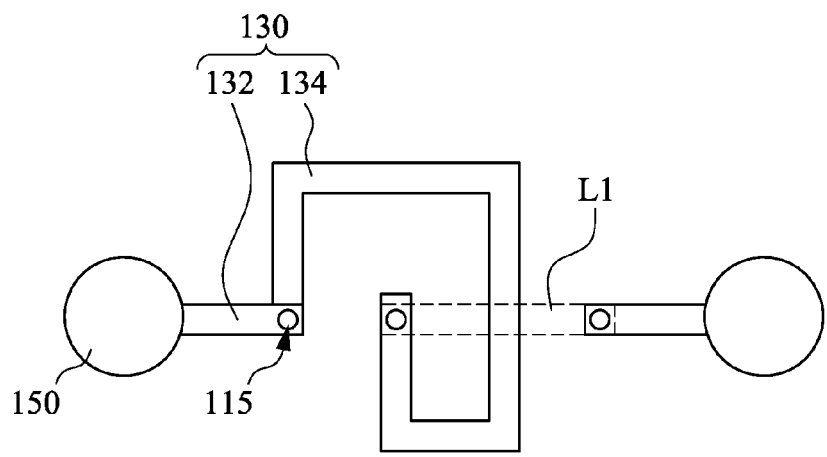
FIG. 11B is a schematic view of a layout of a redistribution layer of the chip package shown in FIG. 11A.

FIG. 11A is a cross-sectional view of a chip package 100a according to another embodiment of the present invention. FIG. 11B is a schematic view of the layout of the redistribution layer 130 of the chip package 100a shown in FIG. 11A. As shown in FIG. 11A and FIG. 11B. The chip package 100a includes the chip 110, the isolation layer 120 and the redistribution layer 130. The redistribution layer 130 includes the connection portion 132 and the passive component portion 134. The difference between this embodiment and the embodiment shown in FIG. 1 and FIG. 2 is that herein the passive component portion 134 is planar spiral-shaped. The chip 110 has a conducting wire L1 located on the protection layer 116, and the conducting wire L1 is connected to the electrical pad 114 and another adjacent electrical pad 114.

Figure 12A:
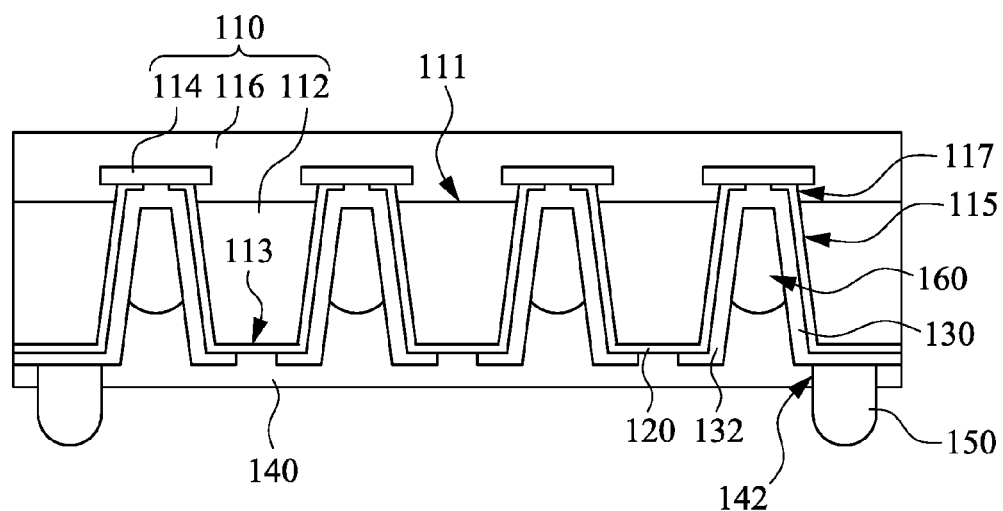
FIG. 12A is a cross-sectional view of a chip package according to further another embodiment of the present invention.
Figure 12B:
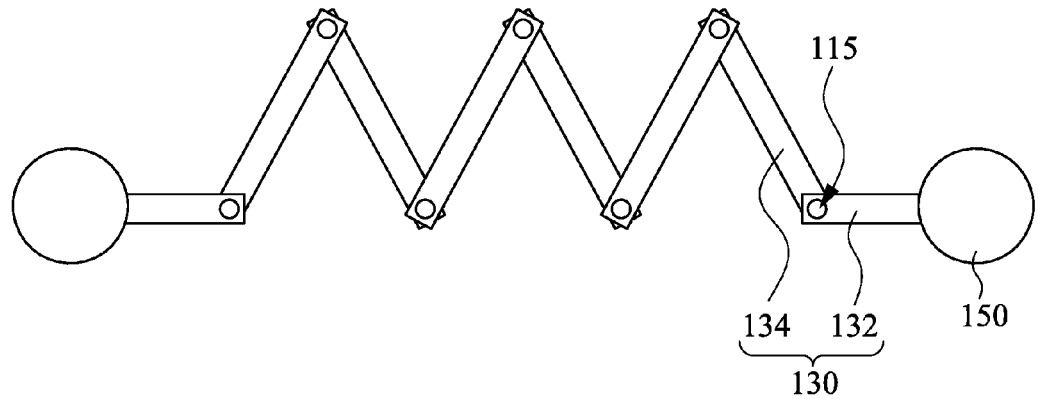
FIG. 12B is a schematic view of a layout of a redistribution layer of the chip package in FIG. 12A.

FIG. 12A is a cross-sectional view of a chip package 100b according to further another embodiment of the present invention. FIG. 12B is a schematic view of the layout of the redistribution layer 130 of the chip package 100b in FIG. 12A. As shown in FIG. 12A and FIG. 12B, the chip package 100b includes the chip 110, the isolation layer 120, and the redistribution layer 130. The redistribution layer 130 includes the connection portion 132 and the passive component portion 134. The difference between this embodiment and the embodiment shown in FIG. 1 and FIG. 2 is that herein the passive component portion 134 is three-dimensional spiral-shaped. That is to say, the passive component portion 134 is not at the same level.

Figure 12C:
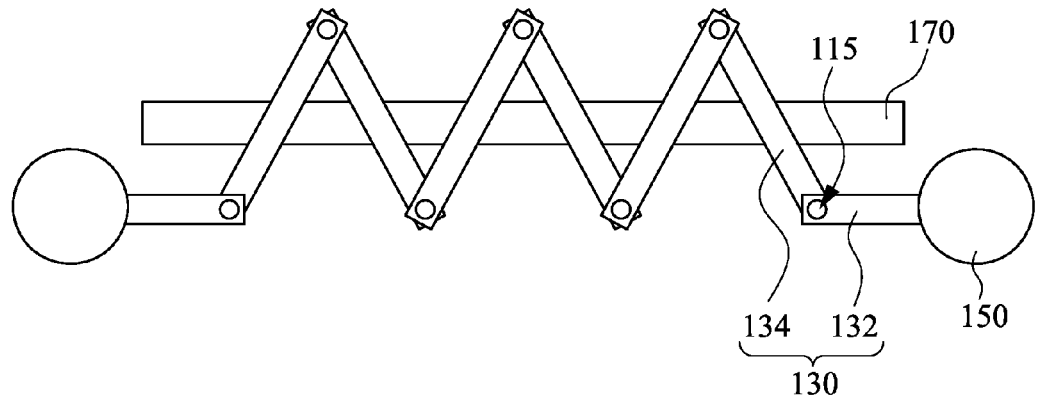
FIG. 12C is another embodiment of FIG. 12B.

FIG. 12C is another embodiment of FIG. 12B. As shown in FIG. 12A and FIG. 12C, the chip package 100b includes the chip 110, the isolation layer 120, and the redistribution layer 130. The redistribution layer 130 includes the connection portion 132 and the passive component portion 134. The difference between this embodiment and the embodiment shown in FIG. 12B is that herein the chip 110 further includes a magnetic component 170, and the magnetic component 170 is surrounded by the passive component portion 134 of the redistribution layer 130. In this exemplary embodiment, the magnetic component 170 can increase the inductance value of the chip package 100b.

Figure 13:
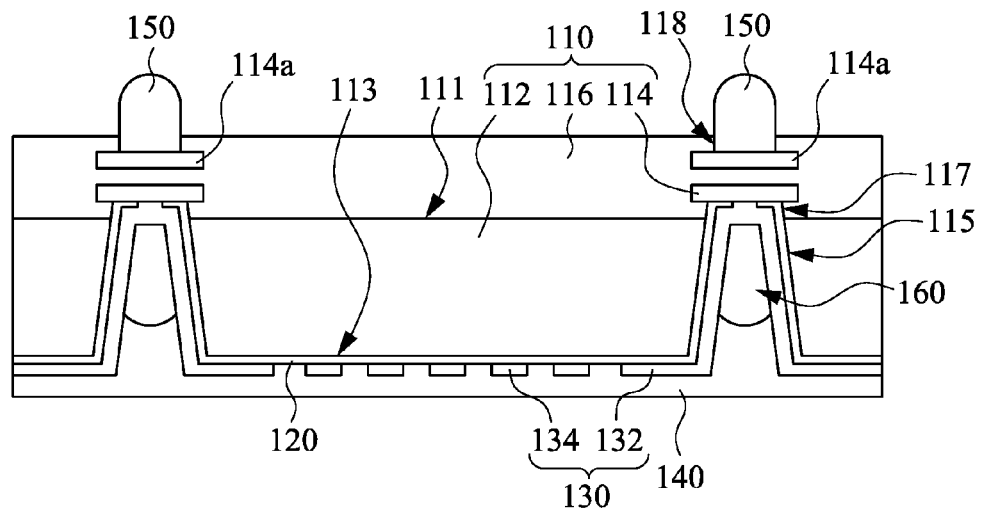
FIG. 13 is a cross-sectional view of a chip package according to further another embodiment of the present invention.

FIG. 13 is a cross-sectional view of a chip package 100c according to further another embodiment of the present invention. The chip package 100c includes the chip 110, the isolation layer 120, and the redistribution layer 130. The redistribution layer 130 includes the connection portion 132 and the passive component portion 134. The chip 110 has the first electrical pad 114. The difference between this embodiment and the embodiment shown in FIG. 1 is that herein the chip 110 further includes a second electrical pad 114a. The second electrical pad 114a is located in the protection layer 116 and the first electrical pad 114 is located between the second electrical pad 114a and the substrate 112. Moreover, the protection layer 116 has an opening 118 to expose the second electrical pad 114a. The conductive structure 150 is located on the second electrical pad 114a that is in the opening 118 of the protection layer 116. The second electrical pad 114a may be electrically connected to the first electrical pad 114 through a conductor that is in the protection layer 116.

Figure 14:
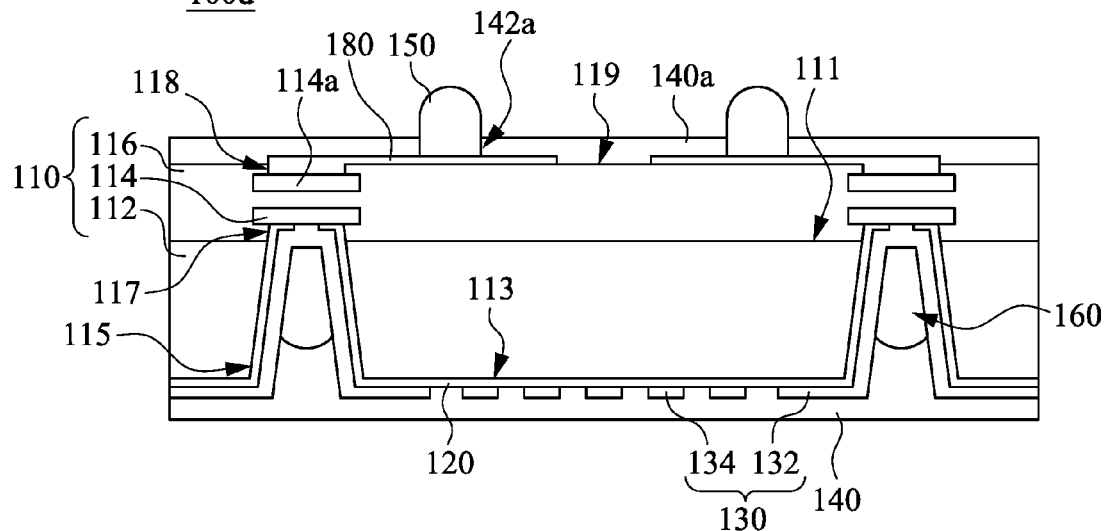
FIG. 14 is a cross-sectional view of a chip package according to further another embodiment of the present invention.

FIG. 14 is a cross-sectional view of a chip package 100d according to further another embodiment of the present invention. The chip package 100d includes the chip 110, the isolation layer 120, and the redistribution layer 130. The redistribution layer 130 includes the connection portion 132 and the passive component portion 134. The difference between this embodiment and the embodiment shown in FIG. 13 is that herein the chip package 100d further includes a conductive layer 180 and a barrier layer 140a. The conductive layer 180 is located on a surface 119 of the protection layer 116 facing away from the substrate 112 and on the second electrical pad 114a that is in the opening 118 of the protection layer 116. The barrier layer 140a covers the conductive layer 180 and the protection layer 116, and the barrier layer 140a has an opening 142a to expose the conductive layer 180. The conductive structure 150 is located on a conductive layer 180 that is in the opening 142a of the barrier layer 140a, such that the conductive structure 150 is electrically connect to the second electrical pad 114a through the conductive layer 180.

In the following description, a method for forming a redistribution layer that is to be patterned with a uniform thickness after the process of FIG. 8 will be described.

Figure 15:
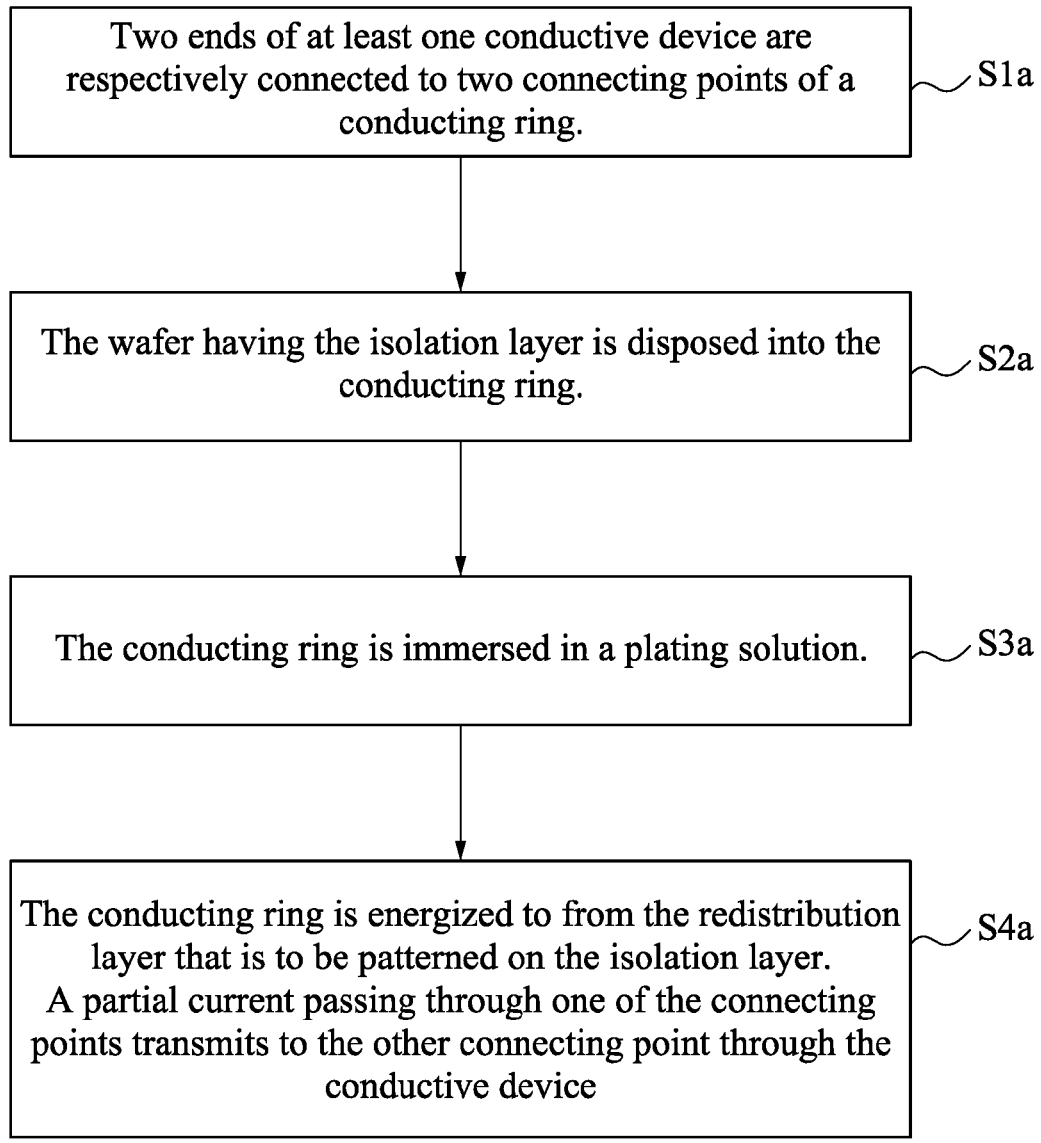
FIG. 15 is a flow chart of an operating method of a semiconductor electroplating system according to an embodiment of the present invention.

FIG. 15 is a flow chart of an operating method of a semiconductor electroplating system according to an embodiment of the present invention. After the isolation layer 120 of FIG. 8 is formed, in step S1a, two ends of at least one conductive device are respectively connected to two connecting points of a conducting ring. Next, in step S2a, the wafer having the isolation layer is disposed into the conducting ring. In step S3a, the conducting ring is immersed in a plating solution. Finally, in step S4a, the conducting ring is energized to from the redistribution layer that is to be patterned on the isolation layer. A partial current passing through one of the connecting points transmits to the other connecting point through the conductive device. The details of the aforementioned steps will be described in the following descriptions.

Figure 16:
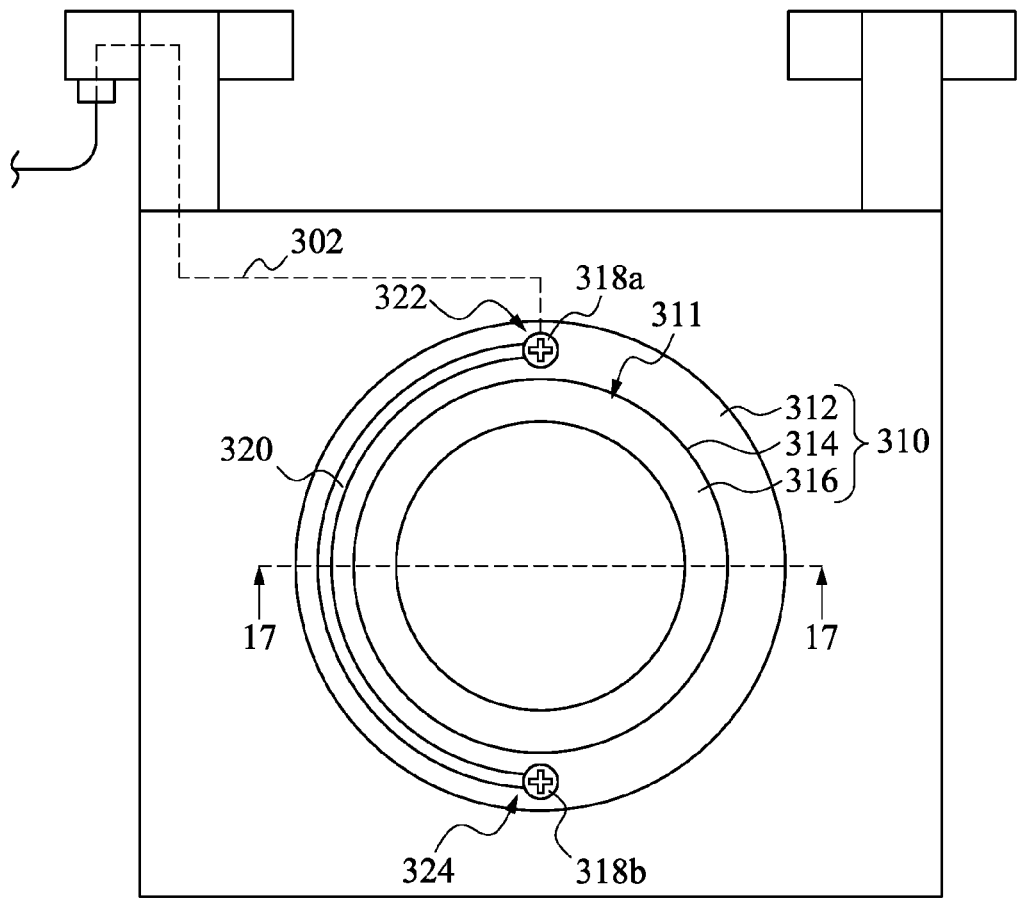
FIG. 16 is a top view of a semiconductor electroplating system according to an embodiment of the present invention.
Figure 17:
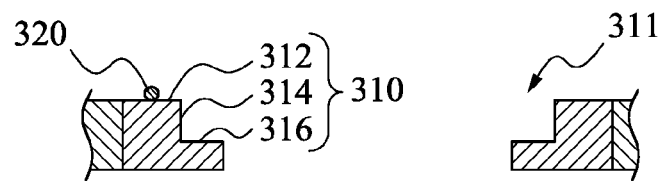
FIG. 17 is a cross-sectional view of the semiconductor electroplating system taken along line 17-17 shown in FIG. 16.

FIG. 16 is a top view of a semiconductor electroplating system 300 according to an embodiment of the present invention. FIG. 17 is a cross-sectional view of the semiconductor electroplating system 300 taken along line 17-17 shown in FIG. 16. As shown in FIG. 16 and FIG. 17, the semiconductor electroplating system 300 includes a conducting ring 310 and at least one conductive device 320. The conducting ring 310 can be used to carry the semiconductor structure of FIG. 8. The conducting ring 310 has at least two connecting points 318a and 318b. The connecting points 318a and 318b may be screws or blots, and the conductive device 320 may be an electric wire, but the present invention is not limited in this regard. In operation, two ends 332 and 324 of the conductive device 320 may be respectively connected to the two connecting points 318a and 318b of the conducting ring 310, and the conductive device 320 is disposed along the edge of the conducting ring 310. After the semiconductor electroplating system 300 in FIG. 16 is assembled, the wafer 110a having the isolation layer 120 shown in FIG. 8 may be disposed in the conducting ring 310.

In this embodiment, the conducting ring 310 has a top surface 312, a sidewall 314, and a supporting surface 316 which are sequentially connected. The connecting points 318a and 318b and the conductive device 320 are disposed on the top surface 312 of the conducting ring 310. The sidewall 314 surrounds an accommodating space 311, and the supporting surface 316 is protruded from the accommodating space 311, such that the top surface 312, the sidewall 314, and the supporting surface 316 form a ladder structure.

The accommodating space 311 can hold the wafer 110a of FIG. 8, and the wafer 110a can be disposed on the supporting surface 316, such that the wafer 110a is surrounded by the sidewall 314. The first surface 111 of the wafer 110a (front surface) faces the supporting surface 316.

After the wafer 110a of FIG. 8 is disposed in the conducting ring 310, the conducting ring 310 and the wafer 110a that has the electrical pad 114 therein are immersed in a plating solution and are energized, such that the circuit can flow into the conducting ring 310 through the conducting wire 302. In this embodiment, the connecting point 318a of the conducting ring 310 can be connected to the conducting wire 302 and to an end 332 of the conductive device 320 at the same time.

Figure 18:
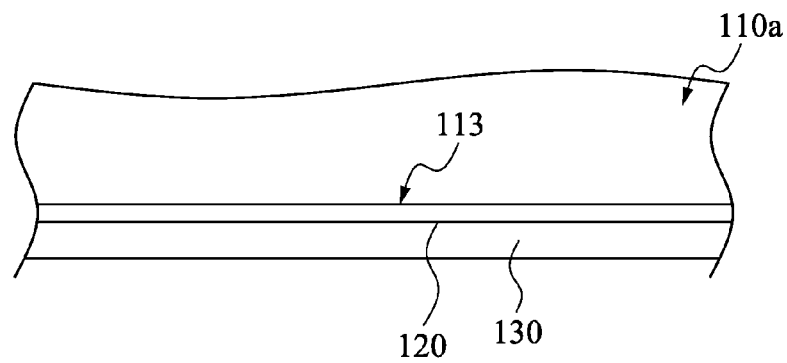
FIG. 18 is a cross-sectional view of a redistribution layer that is to be patterned after being formed on an isolation layer shown in FIG. 8 through the semiconductor electroplating system shown in FIG. 16.

FIG. 18 is a cross-sectional view of the redistribution layer 130 that is to be patterned after being formed on the isolation layer 120 shown in FIG. 8 through the semiconductor electroplating system 300 shown in FIG. 16. As shown in FIG. 16 and FIG. 18, after the conducting ring 310 is energized, the redistribution layer 130 that is to be patterned can be formed on the isolation layer 120. The conductive device 320 can transmit a partial current that passes through the connecting point 318a to another connecting point 318b, such that the redistribution layer 130 on the second surface 113 (back surface) has a uniform thickness. If there is no conductive device 320 disposed on the conducting ring 310, while energizing, due to the impedance of the conducting ring 310 itself, and the distance which the current flows to the place adjacent to the connecting point 318a of the conducting ring 310 is shorter than the distance which the current flows to the place adjacent to the connecting point 318b of the conducting ring 310, it is easy to cause the redistribution layer 130 adjacent to the connecting point 318a is thicker than the redistribution layer 130 adjacent to the connecting point 318b.

In this embodiment, the conductive device 320 on the conducting ring 310 has the function of dispersing the current. When the wafer 110a of FIG. 8 located in the conducting ring 310 is immersed in the plating solution, the conductive device 320 can lead a partial current that passes through the connecting point 318a of the conducting ring 310 to a specific place (e.g., the connecting point 318b), such that the thickness of the redistribution layer 130 formed adjacent to the connecting point 318a is reduced, and the thickness of the redistribution layer 130 formed adjacent to the connecting point 318b is increased. Hence, the thickness uniformity of the redistribution layer 130 that is to be patterned can be improved. As a result, the standard deviation of each place of the redistribution layer 130 on the second surface 113 (back surface) of the wafer 110a can be reduced to 0.2 μm to 0.4 μm. The designer can change the positions of the conductive device 320 and of the connecting points 318a and 318b on the top surface 312 of the conducting ring 310, and the number of the conductive device 320 and of the connecting points 318a and 318b according to the design requirements.

After the redistribution layer 130 is patterned, the passive component portion 134 of FIG. 9 would have a similar thickness, thereby ensuring the function of itself as an integrated passive device (IPD).

It is to be noted that the connection relationships and materials of the elements described above will not be repeated in the following description, and only aspects related to other types of semiconductor electroplating system and operating method will be described.

Figure 19:
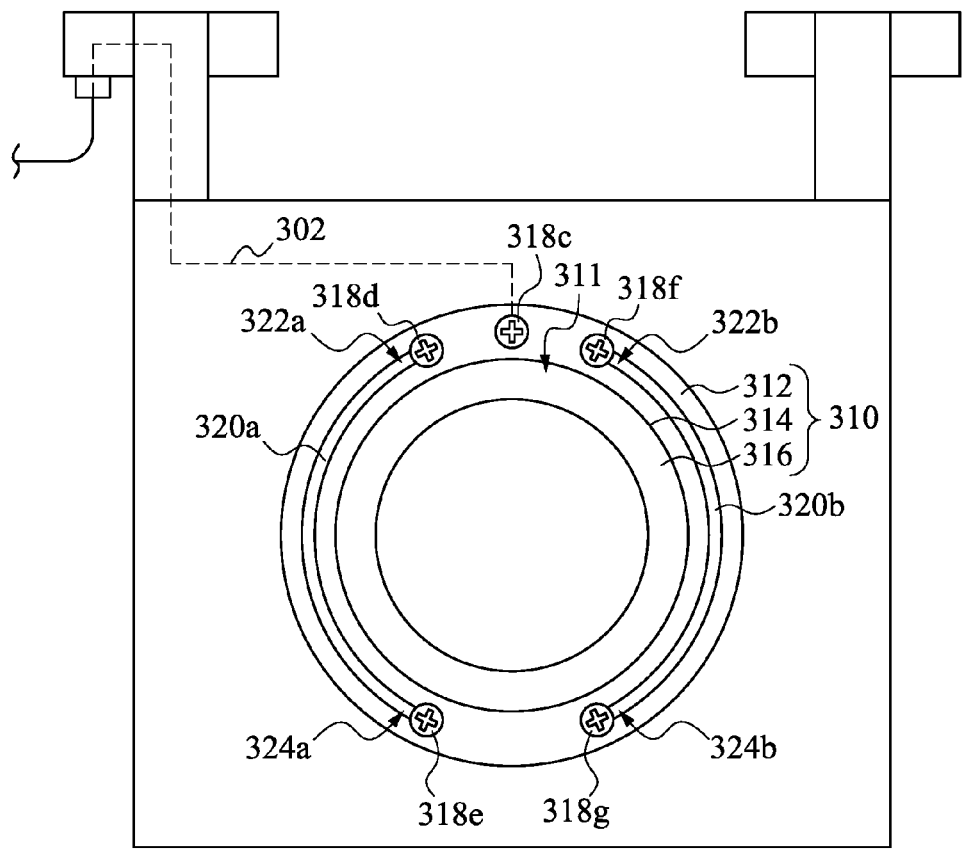
FIG. 19 is a top view of a semiconductor electroplating system according to an embodiment of the present invention.

FIG. 19 is a top view of a semiconductor electroplating system 300a according to an embodiment of the present invention. The semiconductor electroplating system 300a includes the conducting ring 310 and conductive devices 320a and 320b. The difference between this embodiment and the embodiment shown in FIG. 16 is that herein the semiconductor electroplating system 300a has two conductive devices 320a, 320b and five connecting points 318c, 318d, 318e, 318f, 318g. The connecting point 318c is connected to the conducting wire 302 which provides the current. Two ends 322a and 324a of the conductive device 320a are respectively connected to the two connecting points 318d, 318e of the conducting ring 310, and two ends 322b, 324b of the conductive device 320b are respectively connected to the two connecting points 318f and 318g of the conducting ring 310.

In this embodiment, when the wafer 110a in FIG. 8 located in the conducting ring 310 is immersed in the plating solution, the conductive device 320a can lead a partial current that passes through the connecting point 318d of the conducting ring 310 to the connecting point 318e, and the conductive device 320b can lead a partial current that passes through the connecting point 318f of the conducting ring 310 to the connecting point 318g, thereby reducing the thickness of the redistribution layer 130 formed adjacent to the connecting points 318d and 318f and increasing the thickness of the redistribution layer 130 formed adjacent to the connecting point 318e and 318g. As a result, the thickness uniformity of the redistribution layer 130 that is to be patterned is improved.

Figure 20:
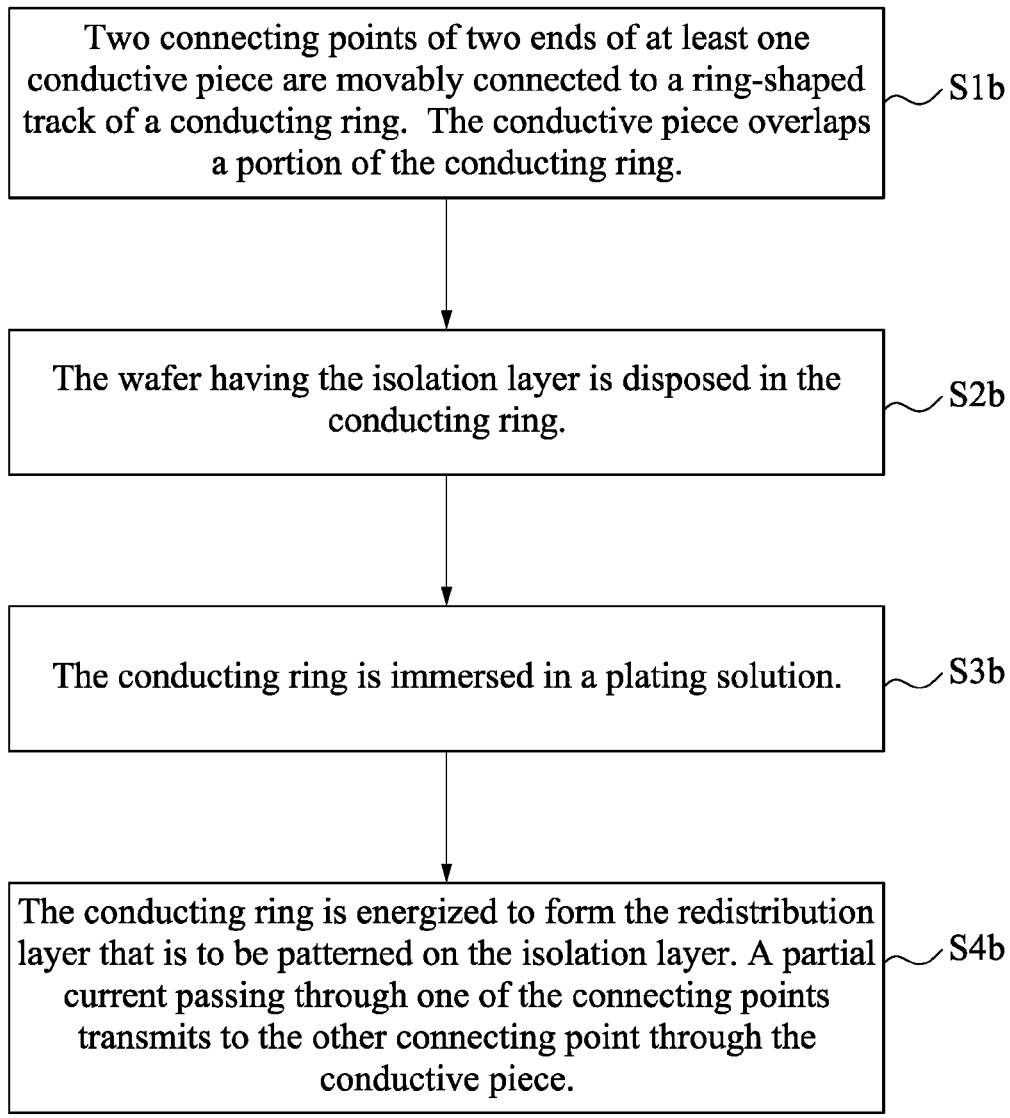
FIG. 20 is a flow chart of an operating method of a semiconductor electroplating system according to an embodiment of the present invention.

FIG. 20 is a flow chart of an operating method of a semiconductor electroplating system according to an embodiment of the present invention After the isolation layer 120 of FIG. 8 is formed, in step S1b, two connecting points of two ends of at least one conductive piece are movably connected to a ring-shaped track of a conducting ring. The conductive piece overlaps a portion of the conducting ring. Next, in step S2b, the wafer having the isolation layer is disposed in the conducting ring. In step S3b, the conducting ring is immersed in a plating solution. Finally, in step S4b, the conducting ring is energized to form the redistribution layer that is to be patterned on the isolation layer. A partial current passing through one of the connecting points transmits to the other connecting point through the conductive piece. The details of the aforementioned steps will be disclosed in the following descriptions.

Figure 21:
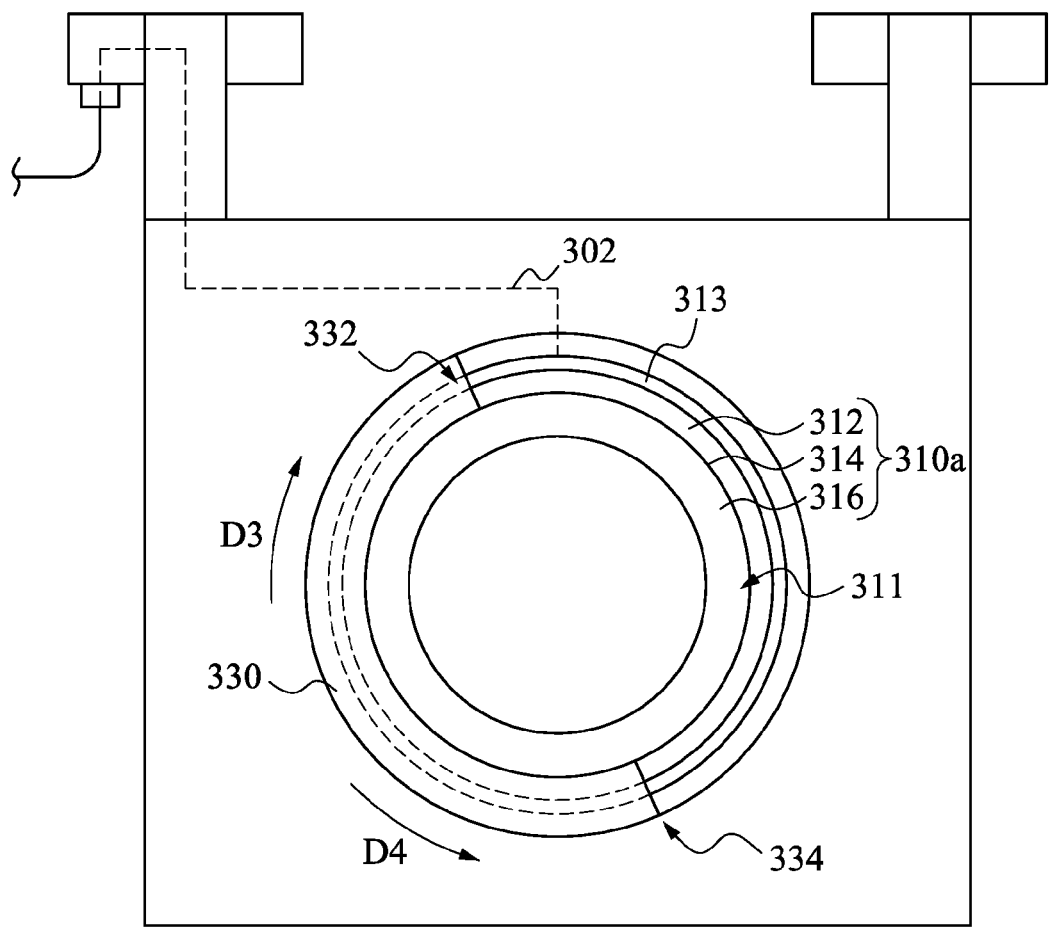
FIG. 21 is a top view of a semiconductor electroplating system according to an embodiment of the present invention.

FIG. 21 is a top view of a semiconductor electroplating system 300b according to an embodiment of the present invention. The semiconductor electroplating system 300b includes a conducting ring 310a and at least one conductive piece 330. The conducting ring 310a can be used to carry semiconductor structure of FIG. 8. The conducting ring 310a has a ring-shaped track 313. Each of the two ends 332 and 334 of the conductive piece 330 has a connecting point that is movably connected to the ring-shaped track 313 of the conducting ring 310a. For instance, the connecting points of the two ends 332 and 334 of the conductive piece 330 may be protrusions, and the ring-shaped track 313 may be a slot that can be coupled to the protrusions, or, the connecting points of the two ends 332 and 334 of the conductive piece 330 may be metal wheels, and the ring-shaped track 313 may be a slot that can be coupled to the wheels. After the conductive piece 330 is connected to the ring-shaped track 313 of the conducting ring 310a, the conductive piece 330 overlaps a portion of the conducting ring 310a, and the conductive piece 330 can be stressed to move on and along the ring-shaped track 313 in a clockwise direction D3 or a counterclockwise direction D4. After the semiconductor electroplating system 300b of FIG. 21 is assembled, the wafer 110a having the isolation layer 120 shown in FIG. 8 can be disposed in the conducting ring 310a.

In this embodiment, the conducting ring 310a has the top surface 312, the sidewall 314, and the supporting surface 316 which are sequentially connected. The conductive piece 330 and the ring-shaped track 313 are both disposed on the top surface 312 of the conducting ring 310a. The sidewall 314 surrounds the accommodating space 311, and the supporting surface 316 is protruding from the accommodating space 311, such that the top surface 312, the sidewall 314, and the supporting surface 316 form a ladder structure. The accommodating space 311 can hold the wafer 110a of FIG. 8, and the wafer 110a can be disposed on the supporting surface 316, such that the wafer 110a is surrounded by the sidewall 314. The first surface 111 of the wafer 110a (front surface) faces the supporting surface 316.

After the wafer 110a of FIG. 8 is disposed in the conducting ring 310a, the conducting ring 310a and the wafer 110a that has the isolation layer 120 may be immersed in a plating solution and energized, the circuit can flow into the conducting ring 310a through the conducting wire 302.

As shown in FIG. 21 and FIG. 18. After the conducting ring 310a is energized, the redistribution layer 130 that is to be patterned can be formed on the isolation layer 120. The conductive piece 330 can transmit a partial current that passes through the connecting point of the end 332 to the connecting point of the other end 334, such that the redistribution layer 130 on the second surface 113 (back surface) has a uniform thickness. In this embodiment, the conductive piece 330 located on the conducting ring 310a has the function of dispersing the current. When the wafer 110a of FIG. 8 located in the conducting ring 310a is immersed in the plating solution, the conductive piece 330 can lead a partial current that passes through the connecting point of one end 332 in contact with the conducting ring 310a to a specific place (such as the connecting point of the other end 334), thereby reducing the thickness of the redistribution layer 130 formed adjacent to the end 332 of the conductive piece 330 and increasing the thickness of the redistribution layer 130 formed adjacent to the end 334 of the conductive piece 330. As a result, the thickness uniformity of the redistribution layer 130 that is to be patterned can be improved.

The designer may slide the conductive piece 330 on the ring-shaped track 313 of the top surface 312 of the conducting ring 310a according to the design requirements, such that the positions of the two ends 332 and 334 of the conductive piece 330 on the top surface 312 are adjusted.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip package, comprising:
   a chip having a substrate, a first electrical pad, and a protection layer, wherein the substrate has a first surface and an opposite second surface, the protection layer is located on the first surface, and the first electrical pad is located in the protection layer, and the substrate has a through hole, and the protection layer has a concave hole, such that the first electrical pad is exposed through the concave hole and the through hole;
   an isolation layer located on the second surface, a sidewall of the through hole, and a sidewall of the concave hole; and
   a redistribution layer comprising:
      a connection portion located on the isolation layer and in electrical contact with the first electrical pad; and
      a passive component portion located on the isolation layer that is on the second surface, wherein an end of the passive component portion is connected to the connection portion that is on the second surface.

2. The chip package of claim 1, wherein shapes of the passive component portion comprise U-shape, planar spiral-shape, and three-dimensional spiral-shape.

3. The chip package of claim 1, wherein the chip has a conducting wire that is in the protection layer, and the conducting wire is connected to the first electrical pad to another adjacent first electrical pad.

4. The chip package of claim 1, further comprising:
   a barrier layer located on the redistribution layer and on the isolation layer that is on the second surface.

5. The chip package of claim 4, wherein the barrier layer has an opening to expose the connection portion, and the chip package further comprises:
   a conductive structure located on the connection portion in the opening of the barrier layer, such that the conductive structure is electrically connected to the first electrical pad.

6. The chip package of claim 5, wherein the conductive structure is a solder ball or a conductive bump.

7. The chip package of claim 1, wherein the chip further comprises:
   a second electrical pad located in the protection layer, wherein the first electrical pad is located between the second electrical pad and the substrate.

8. The chip package of claim 7, wherein the protection layer has an opening to expose the second electrical pad.

9. The chip package of claim 8, further comprising:
   a conductive structure located on the second electrical pad that is in the opening of the protection layer.

10. The chip package of claim 8, further comprising:
    a conductive layer located on a surface of the protection layer facing away from the substrate and on the second electrical pad that is in the opening of the protection layer.

11. The chip package of claim 10, further comprising:
    a barrier layer covering the conductive layer and the protection layer.

12. The chip package of claim 11, wherein the barrier layer has an opening to expose the conductive layer, and the chip package further comprises:
    a conductive structure located on the conductive layer that is in the opening of the barrier layer, such that the conductive structure is electrically connected to the second electrical pad.

13. The chip package of claim 4, wherein the chip package has a cavity, and the cavity is located between the barrier layer and the connection portion that is in the through hole.

14. The chip package of claim 1, further comprising:
    a magnetic component surrounded by the passive component portion.

15. A manufacturing method of a chip package, comprising:

using a temporary adhesive layer to attach a carrier to a wafer, wherein the wafer has a substrate, an electrical pad, and a protection layer, and the substrate has a first surface and an opposite second surface, and the protection layer is located on the first surface, and the electrical pad is located in the protection layer;

etching the second surface of the substrate, thereby forming a through hole in the substrate;

etching the protection layer that is in the through hole, thereby forming a concave hole in the protection layer and exposing the electrical pad through the concave hole and the through hole;

forming an isolation layer on the second surface, a sidewall of the through hole, and a sidewall of the concave hole;

forming a redistribution layer on the isolation layer and the electrical pad; and patterning the redistribution layer for simultaneously forming a connection portion and a passive component portion in the redistribution layer, wherein the connection portion is located on the isolation layer and in electrical contact with the electrical pad, and the passive component portion is located on the isolation layer that is on the second surface, and an end of the passive component portion is connected to the connection portion that is on the second surface.

16. The manufacturing method of claim 15, further comprising:
grinding the second surface of the substrate, thereby reducing a thickness of the substrate.

17. The manufacturing method of claim 15, further comprising:
forming a barrier layer on the redistribution layer and the isolation layer that is on the second surface; and
patterning the barrier layer for forming an opening, thereby exposing the connection portion through the opening.

18. The manufacturing method of claim 17, further comprising:
forming a conductive structure on the connection portion that is in the opening of the barrier layer, such that the conductive structure is electrically connected to the electrical pad.

19. The manufacturing method of claim 18, further comprising:
cutting the carrier, the wafer, the isolation layer and the barrier layer.

20. The manufacturing method of claim 19, further comprising:
removing adhesion of the temporary adhesive layer, and removing the carrier for forming the chip package.

21. The manufacturing method of claim 15, wherein forming the redistribution layer on the isolation layer and on the electrical pad comprises:

connecting two ends of at least one conductive device to two connecting points of a conducting ring respectively;

disposing the wafer having the isolation layer into the conducting ring;

immersing the conducting ring in a plating solution; and energizing the conducting ring for forming the redistribution layer that is to be patterned on the isolation layer, wherein a partial current passing through one of the connecting points transmits to the other connecting point through the conductive device.

22. The manufacturing method of claim 21, wherein the conducting ring has a top surface, a sidewall, and a supporting surface which are sequentially connected, and disposing the wafer having the isolation layer into the conducting ring further comprises:
disposing the wafer on the supporting surface, such that the wafer is surrounded by the sidewall, wherein the first surface faces the supporting surface.

23. The manufacturing method of claim 22, further comprising:
disposing the connecting points and the conductive device on the top surface of the conducting ring.

24. The manufacturing method of claim 15, wherein the forming the redistribution layer on the isolation layer and the electrical pad comprises:
movably connecting two connecting points of two ends of at least one conductive piece to a ring-shaped track of a conducting ring, wherein the conductive piece overlaps a portion of the conducting ring;
disposing the wafer having the isolation layer in the conducting ring;
immersing the conducting ring in a plating solution; and
energizing the conducting ring for forming the redistribution layer that is to be patterned on the isolation layer, wherein a partial current passing through one of the connecting points transmits to the other connecting point through the conductive piece.

25. The manufacturing method of claim 24, wherein the conducting ring has a top surface, a sidewall, and a supporting surface which are sequentially connected, and disposing the wafer having the isolation layer into the conducting ring further comprises:
disposing the wafer on the supporting surface, such that the wafer is surrounded by the sidewall, wherein the first surface faces the supporting surface.

26. The manufacturing method of claim 25, further comprising:
sliding the conductive piece on the ring-shaped track of the top surface.

* * * * *